US009594121B2

(12) United States Patent
Frost et al.

(10) Patent No.: US 9,594,121 B2
(45) Date of Patent: Mar. 14, 2017

(54) SYSTEMS AND METHODS FOR ESTIMATING BATTERY PACK CAPACITY

(71) Applicant: GM GLOBAL TECHNOLOGY OPERATIONS LLC, Detroit, MI (US)

(72) Inventors: Patrick Frost, Novi, MI (US); Patricia M. Laskowsky, Ann Arbor, MI (US); Kurt M. Johnson, Brighton, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 280 days.

(21) Appl. No.: 14/245,685

(22) Filed: Apr. 4, 2014

(65) Prior Publication Data
US 2015/0285866 A1 Oct. 8, 2015

(51) Int. Cl.
*G01R 31/36* (2006.01)
(52) U.S. Cl.
CPC ....... *G01R 31/362* (2013.01); *G01R 31/3658* (2013.01)
(58) Field of Classification Search
CPC .................................................. G01R 31/3624
See application file for complete search history.

(56) References Cited

U.S. PATENT DOCUMENTS

| 2003/0160594 A1* | 8/2003 | Trinh | H02J 7/0081 320/156 |
|---|---|---|---|
| 2011/0200902 A1* | 8/2011 | Araki | H01M 8/04552 429/432 |
| 2012/0158330 A1* | 6/2012 | Araki | G01R 31/3679 702/63 |
| 2012/0290234 A1* | 11/2012 | Schaefer | G01R 31/3624 702/63 |
| 2015/0066406 A1* | 3/2015 | Sun | G01R 31/3679 702/63 |
| 2015/0137822 A1* | 5/2015 | Joe | G01R 31/362 324/426 |
| 2015/0205664 A1* | 7/2015 | Janik | G06F 11/1012 714/764 |

FOREIGN PATENT DOCUMENTS

WO WO 2013187582 * 12/2013 ............. G01R 31/36

OTHER PUBLICATIONS

Courtney Taylor, "What is Skewness", Mar. 2013.*

* cited by examiner

*Primary Examiner* — Drew A Dunn
*Assistant Examiner* — Tynese McDaniel
(74) *Attorney, Agent, or Firm* — Phillips Ryther & Winchester; John P. Davis

(57) ABSTRACT

System and methods for estimating a capacity of a battery are presented. A measure of data skewness may be calculated from a battery system terminal voltage measurement. Inflection points in the data skewness of the terminal voltage measurement may align with transition points associated with a battery system. These transitions points may be associated with known SOCs determined from testing and/or characterization of the battery system. Using the detected transitions and associated SOCs and an indication of an accumulated charge provided to/from the battery between the transitions, an estimated capacity of the battery system may be determined.

19 Claims, 9 Drawing Sheets

SYSTEMS AND METHODS FOR ESTIMATING BATTERY PACK CAPACITY

TECHNICAL FIELD

This disclosure relates to systems and methods for estimating a capacity of a battery pack. More specifically, but not exclusively, the systems and methods disclosed herein relate to estimating a capacity of a battery pack by statistically analyzing a dynamic measurement of battery pack voltage.

BACKGROUND

Passenger vehicles often include electric batteries for operating features of a vehicle's electrical and drivetrain systems. For example, vehicles commonly include a 12V lead-acid automotive battery configured to supply electric energy to vehicle starter systems (e.g., a starter motor), lighting systems, and/or ignition systems. In electric, fuel cell ("FC"), and/or hybrid vehicles, a high voltage ("HV") battery system (e.g., a 360V HV battery system) may be used to power electric drivetrain components of the vehicle (e.g., electric drive motors and the like). For example, an HV rechargeable energy storage system ("ESS") included in a vehicle may be used to power electric drivetrain components of the vehicle.

Monitoring a capacity of a battery system may allow for more accurate battery system control and/or management decisions to be made based on such information, thereby improving overall battery performance. Accurate knowledge of the capacity of a battery system may further allow for improved diagnostics and/or prognostic methods to identify potential battery systems issues. Conventional methods for estimating the capacity of a battery system, however, are not particularly accurate for estimating capacity of a battery system utilizing blended cathode chemistries (e.g., a nickel manganese cobalt and lithium manganese oxide chemistry or the like).

SUMMARY

Systems and methods disclosed herein may provide for more accurate determination and/or estimations of a capacity of a battery system, thereby improving battery system control, management, and diagnostic decisions. In certain embodiments, the systems and methods disclosed herein may estimate a capacity of a battery system by statistically analyzing a dynamic measurement of the voltage of a battery system.

Consistent with embodiments disclosed herein, a total accumulation of charge and a measure of data skewness may be calculated from a battery system terminal voltage measurement. Inflection points in the data skewness of the terminal voltage measurement may align with transition points associated with a battery system. These transitions points may be associated with known states of charge ("SOCs") determined from testing and/or characterization of the battery system. Using the detected transitions and associated SOCs and an indication of an accumulated charge between the transitions, an estimated capacity of the battery system may be calculated.

In certain embodiments, a method of estimating a capacity of a battery pack may include receiving battery pack terminal voltage measurement information (e.g., from a voltage sensor or the like). Skewness information may be calculated based on the battery pack terminal voltage measurement information. A first inflection point may be identified in the skewness information, and a first SOC of the battery pack may be determined based on the first inflection point (e.g., based on a terminal voltage associated with the inflection point).

A second SOC of the battery pack may be determined. In certain embodiments, the first and second SOCs may be expressed as percentages of a total SOC of the battery pack. In some embodiments, the second SOC may be associated with a charge termination and/or a charge depletion level. In further embodiments, the second SOC may be determined based on a second identified inflection point.

A net charge difference of the battery pack between the first SOC and the second SOC may be determined. In certain embodiments, the net charge difference may be an amount of charge provided to/from the battery pack between the first and second SOCs during charging/discharging operations. An estimated capacity of the battery pack may be determined based on the net charge difference, the first SOC, and the second SOC. In certain embodiments, the estimated capacity may be determined by dividing the net charge difference by a difference of the first SOC and the second SOC. In certain embodiments, the aforementioned method may be performed by battery control electronics associated with a battery pack and/or implemented using a non-transitory computer-readable medium storing associated executable instructions.

BRIEF DESCRIPTION OF THE DRAWINGS

Non-limiting and non-exhaustive embodiments of the disclosure are described, including various embodiments of the disclosure with reference to the figures, in which.

DETAILED DESCRIPTION

Figure 1:
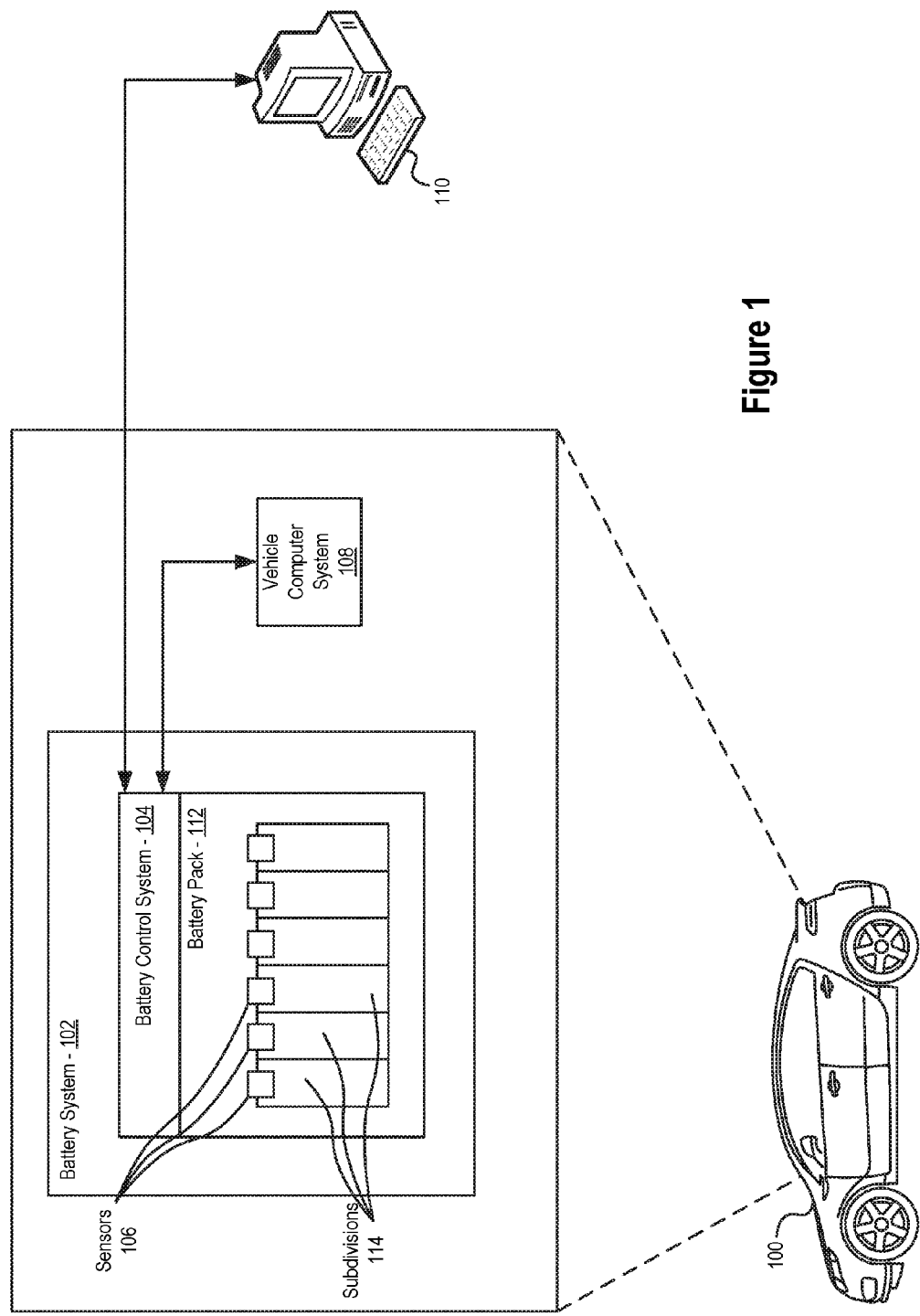
FIG. 1 illustrates an exemplary system for estimating a capacity of a battery system in a vehicle consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

The embodiments of the disclosure will be best understood by reference to the drawings, wherein like parts may be designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor need the steps be executed only once, unless otherwise specified.

Information regarding the capacity of a battery may utilized in a variety of contexts including, without limitation, battery system management, operation, diagnostic, and prognostic decisions. Such information may be used to improve battery performance and/or determination of a state of a battery system, including a SOC and a state of health ("SOH") and/or a range of an associated vehicle. In certain embodiments, a battery system's SOH may a qualitative measure of a battery system's ability to store and deliver electrical energy, while a battery system's SOC may be a measure of electrical energy stored in the battery system. Accurate estimation of a battery system's capacity may further provide a metric for tracking battery system performance degradation over its lifecycle.

In certain embodiments, a battery system may include one or more anode and cathode half-cells. As energy is charged into and/or discharged from the battery, the electrochemical properties of each half-cell may exhibit unique and/or repeatable behaviors observable in a dynamic time-based measurement of a voltage across the anode and cathode half-cells. Consistent with embodiments disclosed herein, by statistically analyzing the dynamic voltage measurement, transitions points associated with certain behaviors may be identified. These transition points may be aligned and/or otherwise associated with certain SOCs. When a transition point is detected, a net charge between the points may be used to estimate the battery's capacity.

Consistent with embodiments disclosed herein, a total accumulation of charge and a measure of data skewness (e.g., real-time data skewness) may be calculated from a battery system terminal voltage measurement. In certain embodiments, the data skewness may represent a measure of how much data is to the left and/or right of the mean of the terminal voltage measurement data. Changes in the slope of the data skewness of the terminal voltage measurement may align with transition points associated with the anode and cathode half-cells. These transitions points may be associated with known SOCs determined from testing and/or characterization of the battery system. Using the detected transitions and an indication of an accumulated charge, an estimated capacity of the battery system may be calculated.

FIG. 1 illustrates an exemplary system for estimating a capacity of a battery system 102 in a vehicle 100 consistent with embodiments disclosed herein. The vehicle 100 may be a motor vehicle, a marine vehicle, an aircraft, and/or any other type of vehicle, and may include an internal combustion engine ("ICE") drivetrain, an electric motor drivetrain, a hybrid engine drivetrain, an FC drivetrain, and/or any other type of drivetrain suitable for incorporating the systems and methods disclosed herein. The vehicle 100 may include a battery system 102 that, in certain embodiments, may be an HV battery system. The HV battery system may be used to power electric drivetrain components (e.g., as in an electric, hybrid, or FC power system). In further embodiments, the battery system 102 may be a low voltage battery (e.g., a lead-acid 12V automotive battery) and may be configured to supply electric energy to a variety of vehicle 100 systems including, for example, vehicle starter systems (e.g., a starter motor), lighting systems, ignition systems, and/or the like.

The battery system 102 may include a battery control system 104. The battery control system 104 may be configured to monitor and control certain operations of the battery system 102. For example, the battery control system 104 may be configured to monitor and control charging and discharging operations of the battery system 102. In certain embodiments, the battery control system 104 may be utilized in connection with the methods disclosed herein to estimate a capacity and/or determine a state of the battery system (e.g., an SOC and/or a SOH of the battery system). In certain embodiments, the battery control system 104 may be communicatively coupled with one or more sensors 106 (e.g., voltage sensors, current sensors, and/or the like, etc.) and/or other systems configured to enable the battery control system 104 to monitor and control operations of the battery system 102. For example, sensors 106 may provide battery control system 104 with information used to estimate a capacity, a SOC, and/or a SOH, estimate a resistance, measure a current, and/or measure voltage of the battery system 102 and/or its constituent components.

The battery control system 104 may further be configured to provide information to and/or receive information from other systems included in the vehicle 100. For example, the battery control system 104 may be communicatively coupled with an internal vehicle computer system 108 and/or an external computer system 110 (e.g., via a wireless telecommunications system or the like). In certain embodiments, the battery control system 104 may be configured, at least in part, to provide information regarding the battery system 102 (e.g., information measured by sensors 106 and/or determined by control system 104) to a user of the vehicle 100, vehicle computer system 108, and/or external computer system 110. Such information may include, for example, battery capacity, SOC, and/or SOH information, battery operating time information, battery operating temperature information, and/or any other information regarding the battery system 102.

The battery system 102 may include one or more battery packs 112 suitably sized to provide electrical power to the vehicle 100. Each battery pack 112 may include one or more subdivisions 114 (e.g., cells). The subdivisions 114 may comprise sub-packs, each of which may comprise one or more battery cells utilizing any suitable battery technology or combination thereof. Suitable battery technologies may include, for example, lead-acid, nickel-metal hydride ("NiMH"), lithium-ion ("Li-Ion"), Li-Ion polymer, lithium-air, nickel-cadmium ("NiCad"), valve-regulated lead-acid ("VRLA") including absorbed glass mat ("AGM"), nickel-zinc ("NiZn"), molten salt (e.g., a ZEBRA battery), nickel manganese cobalt ("NMC"), lithium iron phosphate ("LFP"), lithium manganese oxide ("LMO"), and/or other suitable battery technologies and/or combination thereof. In certain embodiments, the systems and methods disclosed herein may be utilized in connection with estimating capacity of a battery system 102 utilizing blended cathode chemistries (e.g., a NMC/LFT blended cathode battery system or the like).

Each subdivision 114 may be associated with a sensor 106 configured to measure one or more electrical parameters (e.g., voltage, current, impedance, SOC, etc.) associated with each battery subdivision 114. Although FIG. 1 illustrates separate sensors 106 associated with each battery subdivision 114, in some embodiments a sensor configured to measure various electrical parameters associated with a plurality of subdivisions 114 may also be utilized.

The electrical parameters measured by sensors 106 may be provided to battery control system 104 and/or one or more other systems. Using the electrical parameters, battery control system 104 and/or any other suitable system may coordinate the operation of battery system 102 (e.g., charging operations, discharging operations, balancing operations, etc.). In certain embodiments, one or more electrical parameters may be provided by battery control system 104 and/or one or more sensors 106 to vehicle computer system 108, and/or external computer system 110. Based on certain measured electrical parameters, battery control system 104, vehicle computer system 108, and/or any other suitable system may estimate a capacity and/or a state of the battery system 102 and/or any of its constituent subdivisions 114 utilizing methods disclosed herein.

Figure 2:
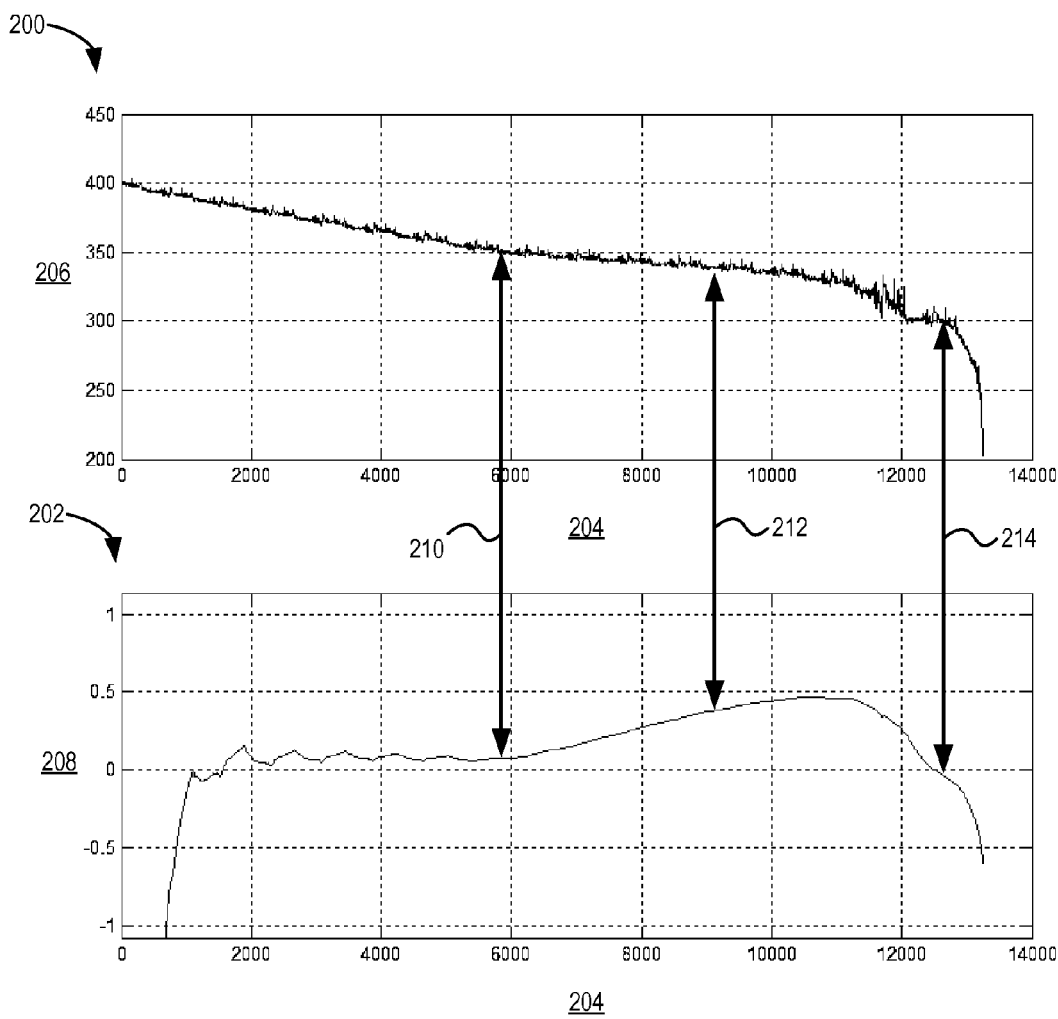
FIG. 2 illustrates graphs showing exemplary measured terminal voltages of a battery pack over time during a driving condition and associated skewness of the measured terminal voltage over time consistent with embodiments disclosed herein.

FIG. 2 illustrates graphs 200, 202 showing exemplary measured terminal voltages of a battery pack over time during a driving condition and associated skewness of the measured terminal voltage over time consistent with embodiments disclosed herein. Graph 200 shows an exemplary measured terminal voltage 206 of a battery pack over time 204 during a driving condition (e.g., a highway driving condition or cycle). Graph 202 shows associated skewness 208 over time 204 of the measured terminal voltage shown in graph 200.

Skewness may comprise a statistical moment of data providing a measure of how much data is to the left and/or right of a mean. In certain embodiments, skewness of a particular set of data (e.g., measured terminal voltage data) may be expressed according to the following:

$$\gamma = E\left[\left(\frac{X-\mu}{\sigma}\right)^3\right] = \frac{E[X^3] - 3\mu\sigma^2 - \mu^3}{\sigma^3} \quad \text{Eq. 1}$$

where $\gamma$ is skewness of the particular set of data, $\mu$ is a mean of the set of data, $\sigma$ is a standard deviation of the set of data, X is a battery pack terminal voltage, and E[ . . . ] is an expectation function. It will be appreciated that skewness of a set of data may be expressed in a variety of other ways in connection with the disclosed embodiments.

Data associated with a driving condition of a vehicle battery pack (e.g., characterization data) may indicate that a spread of measured terminal voltage minimums/maximums may widen as a SOC of the battery pack decreases. This change may affect the skewness of measured voltages. Changes in the skewness behavior and/or associated inflection points, indicated in FIG. 2 by 210-214, may be associated with points at which the battery pack transitions to different chemical voltage behavior regions (e.g., in a blended LFP and/or NMC battery, voltage behavior dominated by LFP and/or voltage behavior dominated by NMC). Consistent with embodiments disclosed herein, inflection points 210-214, may be utilized to estimate a capacity of an associated battery pack. In certain embodiments, such inflection points may be consistent across a SOC of the battery pack and/or a temperature of the battery pack. In some embodiments the systems and/or methods disclosed herein may utilize techniques which are independent of a specific SOC/OCV relationship, which may shift over time.

Figure 3:
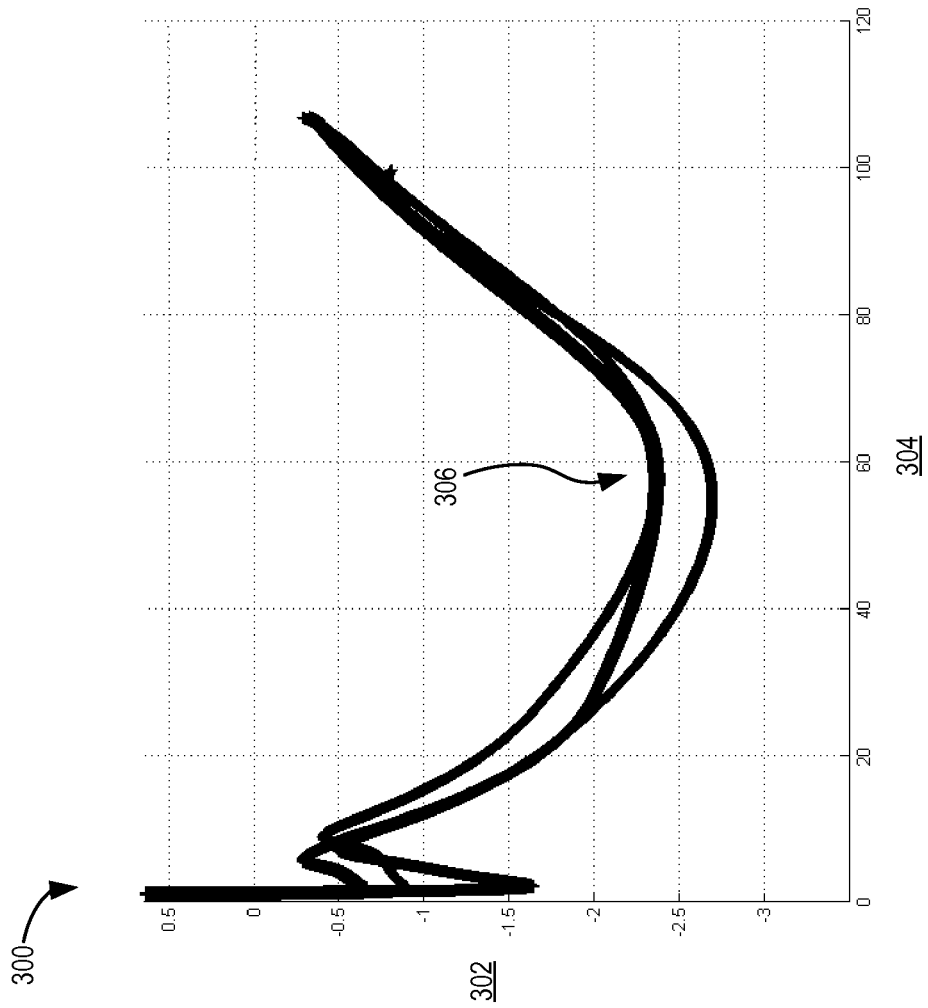
FIG. 3 illustrates a graph showing exemplary skewness of a measured terminal voltage of a battery pack as a function of a SOC of the pack during a charging condition consistent with embodiments disclosed herein.

FIG. 3 illustrates a graph 300 showing exemplary skewness 302 of a measured terminal voltage of a battery pack as a function of a SOC of the pack 304 during a charging condition consistent with embodiments disclosed herein. In certain embodiments, the SOC of the pack 304 illustrated in graph 300 may be an indication of a percentage of a total SOC capacity of the associated battery pack. The skewness curves of graph 300 illustrate exemplary skewness information obtained using battery pack terminal voltage measurements performed during battery pack charging at a plurality of operating temperatures (e.g., −20° C., 0° C., 20° C., and/or the like). As shown, the skewness curves of graph 300 may exhibit a voltage skewness inflection point 306 regardless of operating temperature. Such an inflection point 306 and an associated SOC 304 may be utilized in connection with estimating a capacity of an associated battery pack.

Figure 4:
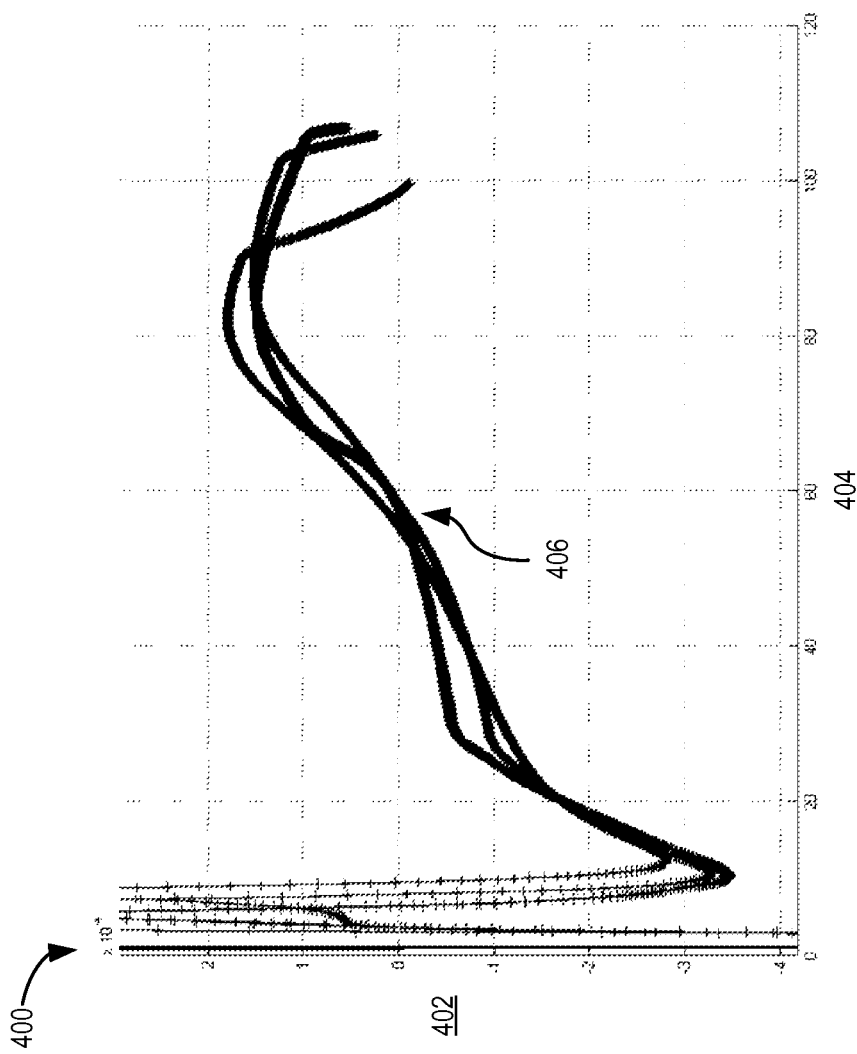
FIG. 4 illustrates a graph showing exemplary change in skewness over time of a measured terminal voltage of a battery pack as a function of a SOC of the pack during a charging condition consistent with embodiments disclosed herein.

FIG. 4 illustrates a graph 400 showing exemplary change in skewness over time (i.e., d$\gamma$/dt) 402 of a measured terminal voltage of a battery pack as a function of a SOC of the pack 404 during a charging condition consistent with embodiments disclosed herein. In certain embodiments, the SOC of the pack 404 illustrated in graph 400 may be an indication of a percentage of a total SOC capacity of the associated battery pack. The illustrated change in skewness over time curves of graph 400 may be associated with exemplary skewness information obtained using battery pack terminal voltage measurements performed during battery pack charging at a plurality of operating temperatures (e.g., −20° C., 0° C., 20° C., etc.).

As illustrated, the change in skewness over time curves may cross a zero point at 406, associated with the inflection point 306 of the curves illustrated in connection with graph 300 of FIG. 3. As discussed in more detail below, an SOC of the pack 404 at point 406 may be used in connection with a known charge amount provided to the battery pack (e.g., measured in Ah or the like) during charging to determine a capacity at a charge termination.

Figure 5:
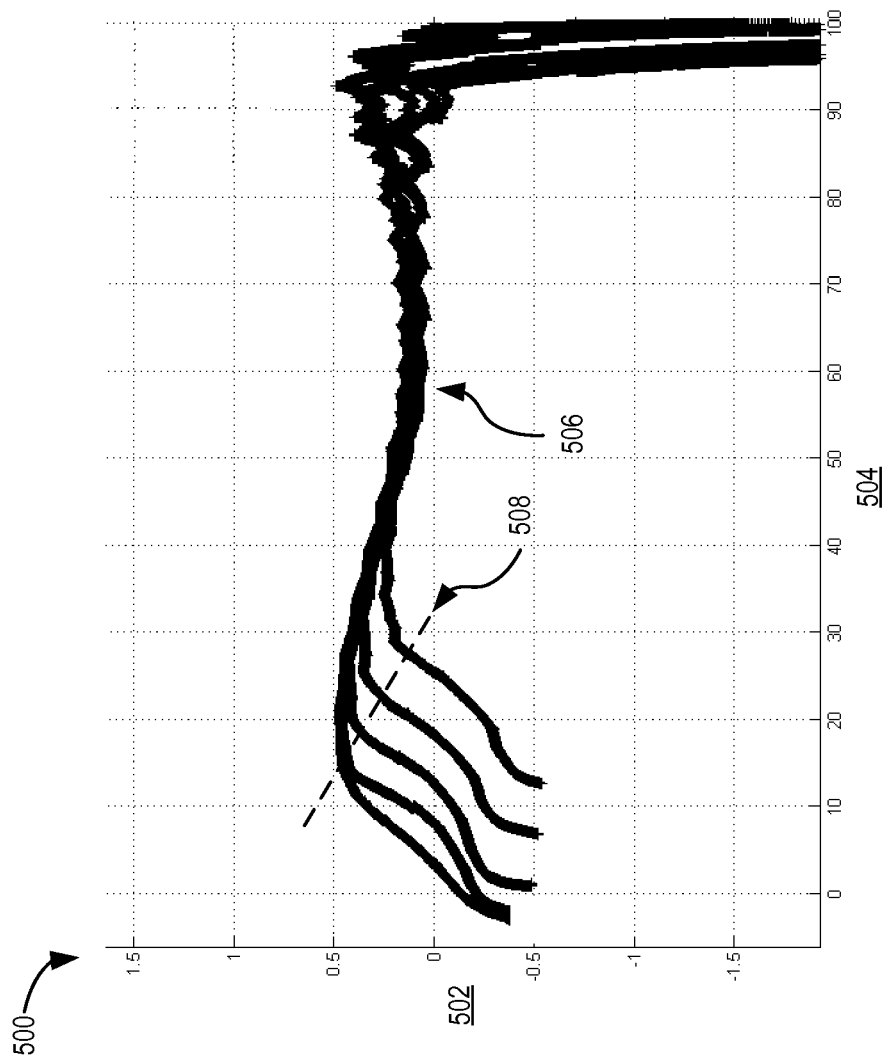
FIG. 5 illustrates a graph showing exemplary skewness of a measured terminal voltage of a battery pack as a function of a SOC of the pack during a driving condition consistent with embodiments disclosed herein.

FIG. 5 illustrates a graph 500 showing exemplary skewness of a measured terminal voltage of a battery pack 502 as a function of a SOC of the pack 504 during a driving condition consistent with embodiments disclosed herein. The SOC of the pack 504 illustrated in graph 500 may be an indication of a percentage of a total SOC capacity of the associated battery pack. The skewness curves of graph 500 illustrate exemplary skewness information obtained using battery pack terminal voltage measurements performed during driving operations with battery pack operating at a plurality of operating temperatures (e.g., −10° C., 0° C., 10° C., 20° C., 30° C., and/or the like).

As illustrated, the skewness curves of graph 500 may exhibit a voltage skewness inflection point 506 regardless of operating temperature. Such an inflection point 506 and an associated SOC 504 may be utilized in connection with estimating a capacity of an associated battery pack. The skewness curves of graph 500 may further exhibit peaks 508 that vary across operating temperatures. In some embodiments, these peaks 508 may be associated with activation of a particular component of a blended chemistry battery pack. For example, in a blended NMC/LFP chemistry battery pack, peaks 508 may be associated with LFP activation within the battery pack.

Figure 6:
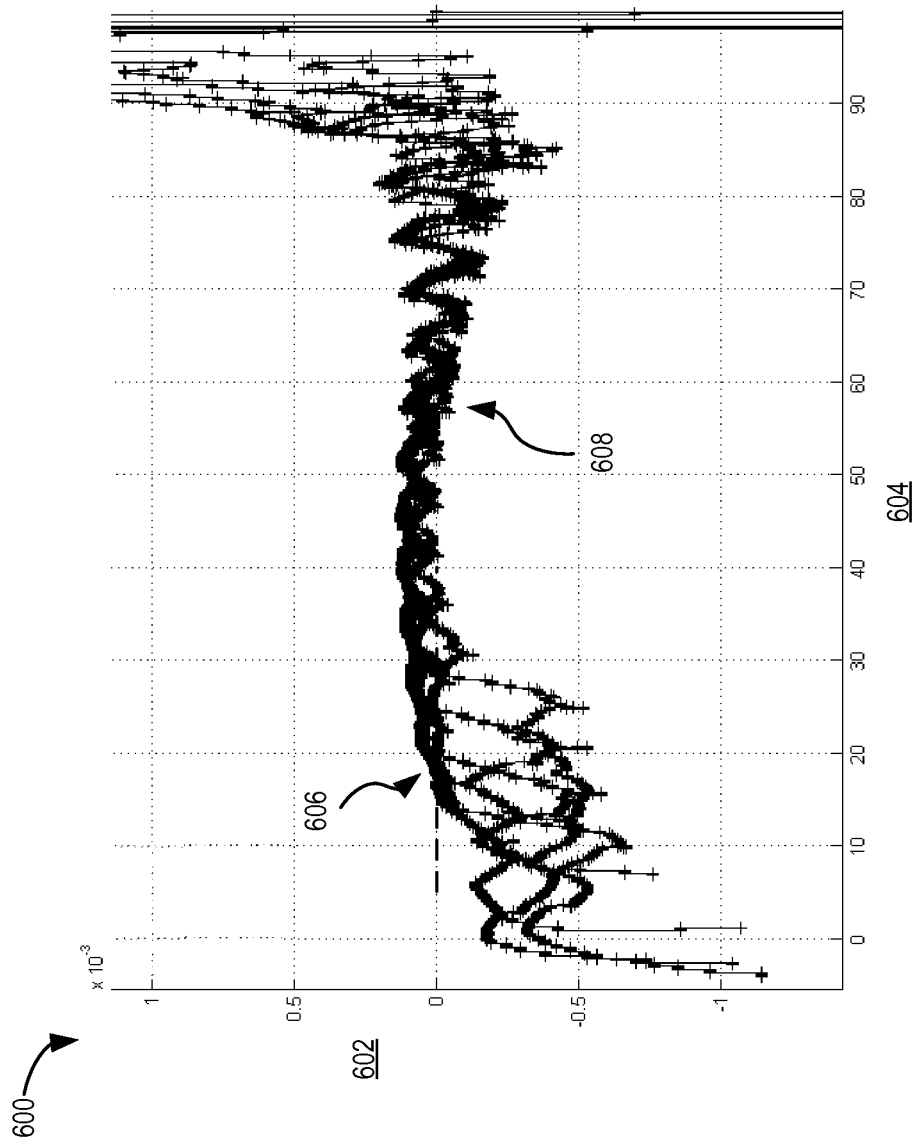
FIG. 6 illustrates a graph showing exemplary change in skewness of a measured terminal voltage of a battery pack over time as a function of a SOC of the pack during a driving condition consistent with embodiments disclosed herein.

FIG. 6 illustrates a graph 600 showing exemplary change in skewness of a measured terminal voltage of a battery pack over time 602 as a function of a SOC of the pack 608 during a driving condition consistent with embodiments disclosed herein. In certain embodiments, the SOC of the pack 604 illustrated in graph 600 may be an indication of a percentage of a total SOC capacity of the associated battery pack. The skewness curves of graph 600 illustrate exemplary skewness information obtained using battery pack terminal voltage measurements performed during driving operations with battery pack operating at a plurality of operating temperatures (e.g., −10° C., 0° C., 10° C., 20° C., 30° C., and/or the like).

As illustrated, the change in skewness over time curves may cross a zero point at 608, associated with the inflection point 506 of the curves illustrated in connection with graph 500 of FIG. 5. The change in skewness over time curves of graph 600 may further exhibit zero point crossings at 608, associated with peaks 508 illustrated in graph 500 of FIG. 5 varying across operating temperatures (e.g., due to LFP activation within the battery pack).

Figure 7:
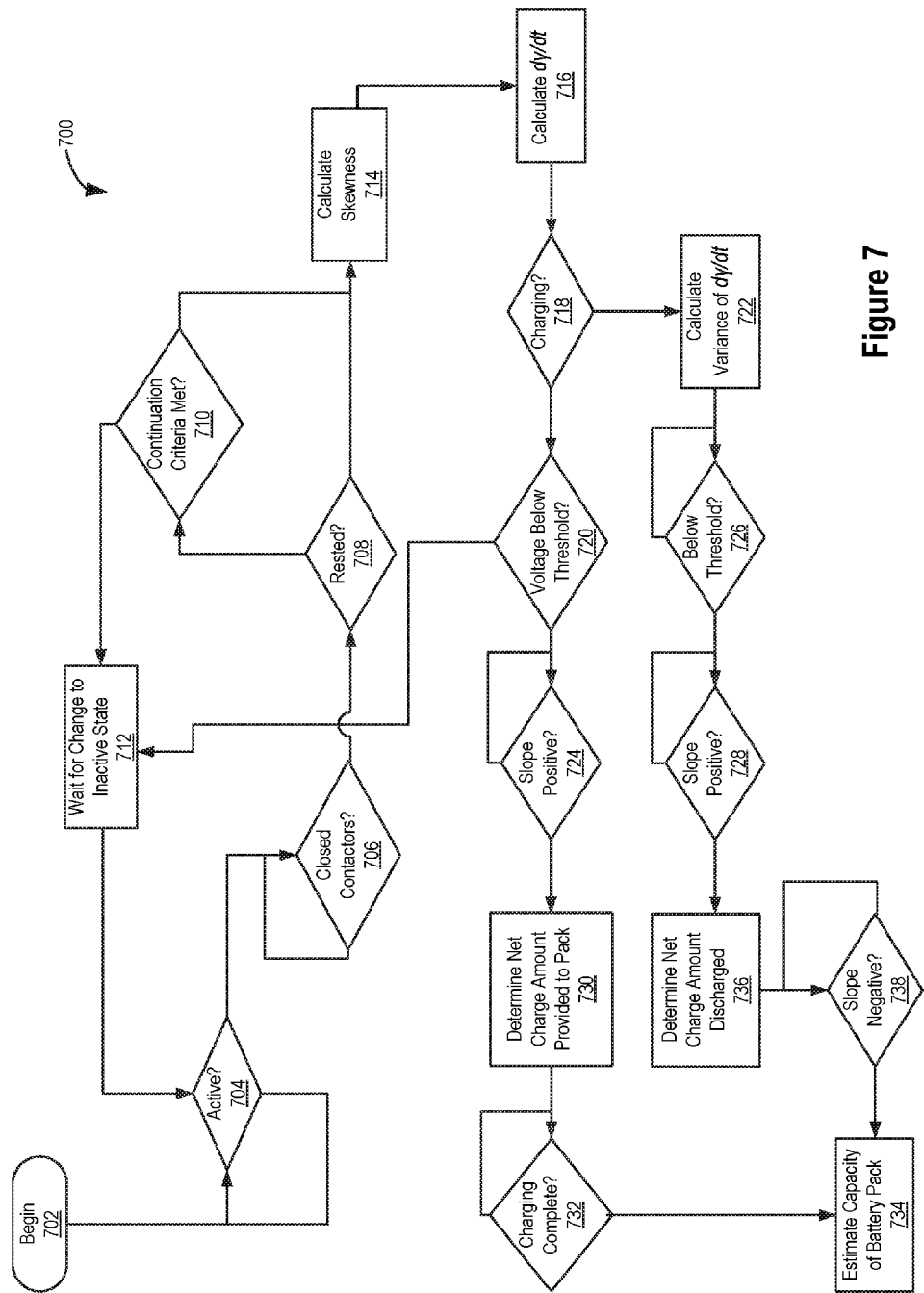
FIG. 7 illustrates a flow chart of an exemplary method for estimating a capacity of a battery pack consistent with embodiments disclosed herein.

FIG. 7 illustrates a flow chart of an exemplary method 700 for estimating a capacity of a battery pack consistent with embodiments disclosed herein. In certain embodiments, method 700 may be utilized in estimating a capacity and/or a state of a battery pack (e.g., SOC and/or SOH). At 702, the method 700 may initiate. At 704, a determination may be made whether a control system (e.g., a vehicle integration or interface control module ("VICM"), a battery management system ("BMS"), etc.) associated with the battery pack is awake and/or otherwise in an active or awake state. If not, the method 700 may cycle until the control system is in an active or awake state. If the control system is in an active or awake state, the method may proceed to 706.

At 706, a determination may be made whether contactors of the battery system (e.g., high voltage contactors) are closed. If the contactors are closed, the method may proceed to 708. Otherwise, the method 700 may cycle until the contactors are closed.

A determination may be made at 708 as to whether the battery pack is rested. If the battery pack is rested, the method 700 may proceed to 714. If not, the method 700 may proceed to 710, where a determination may be made whether certain continuation criteria have been met (e.g., whether the battery pack has been at rest for less than a certain threshold time period). In certain embodiments, the continuation criteria may comprise an amount of time following a vehicle associated with the battery pack being turned off. If short enough, the method 700 may proceed to calculate skewness from where it left off in the last drive/charge; otherwise the calculation may be aborted for a present cycle and not be attempted until a next cycle. If the continuation criteria have not been met, the method 700 may proceed to 712 where a wait for the control system to change to an inactive or sleep state may commence. The method 700 may cycle back to the determination at 704 following 712.

In certain embodiments, steps 702-712 may comprise checks that may occur when a vehicle associated with a battery pack is turned on before the battery pack is used (e.g., used in connection driving operations, charging, etc.). For example, energy may not be drawn from the battery pack until associated bus contactors are closed (e.g., connecting the battery pack to an electric motor and/or a charging device). Accordingly, skewness determinations may not be performed until current begins to be charged and/or discharged from the battery pack (e.g., after the contactors closed).

If a vehicle associated with a battery pack has not operated for a period of time, the battery pack may be rested. In certain embodiments, a rested battery pack may be associated with any built-up polarization evident in a voltage measurement from the battery pack being reaching an equilibrium state. Polarization may occur during charging and/or discharging operations of the battery pack and may be time-vary and/or difficult to measure at a particular time. Accordingly, determining that a battery pack has been rested may help ensure that the systems and methods disclosed herein are not significantly affected by an uncertain level of polarization in the battery pack.

If the continuation criteria have been met at 710, the method may proceed to 714. At 714, skewness (i.e., $\gamma$) of measured battery pack terminal voltage information may be calculated. Based on the calculated skewness, a rate of change of the skewness (i.e., $d\gamma/dt$) may be calculated at 716. The method 700 may then proceed to 718.

At 718, a determination may be made whether the battery pack is in a charging condition (e.g., a plug-in charging condition). If not, a variance in the rate of change of the skewness may be calculated at 722. At 726, a determination may be made whether the calculated variance is below certain thresholds. In certain embodiments, the thresholds may be determined by simulating drive cycles and selecting a variance that enables calculation of an accurate capacity of the battery pack. If the variance is below the thresholds, the method 700 may proceed to 728. Otherwise, the method 700 may cycle until the calculated variance is below the threshold.

A determination may be made at 728 whether a slope of the rate of change of the skewness is positive. If the slope is positive, indicative of a skewness inflection point that may be used in connection with estimating a capacity of the battery pack, the method 700 may proceed to 736. If not, the method 700 may cycle until the slope is determined to be positive.

At 736, a net charge amount discharged from the battery pack may be determined, tracked and/or otherwise measured. A determination may be made at 738 whether a slope of the rate of change of the skewness transitions to being negative. If the slope is positive, the method 700 may cycle until the slope is determined to be negative, continuing to determine a net charge amount discharged from the battery pack. If the slope transitions to being negative, indicative of a skewness inflection point that may be used in connection with estimating a capacity of battery pack, the method may proceed to 734. At 734, a capacity of the battery pack may be estimated based on SOCs associated with the inflection points identified at 728 and 738 and the net charge amount determined at 736 using the methods disclosed herein.

If the determination at 718 indicates that the battery pack is in a charging condition, the method 700 may proceed to 720. At 720, a determination may be made whether a measured starting terminal voltage of the battery pack is below certain thresholds. If so, the method may proceed to 724. If not, the method may return to 712.

At 724, a determination may be made whether a slope of the rate of change of the skewness is positive. If the slope is positive, indicative of a skewness inflection point that may be used in connection with estimating a capacity of the battery pack, the method 700 may proceed to 730. If not, the method 700 may cycle until the slope is determined to be positive.

A net charge amount provided to the battery pack may be determined, tracked and/or otherwise measured at 730. A determination may be made at 732 as to whether the battery pack charging cycle is complete. If not, the method 700 until the charge cycle is complete, continuing to determine a net charge amount provided to the battery pack as part of charging operations. If complete, the method 700 may proceed to 734. At 734, a capacity of the battery pack may be estimated based on SOCs associated with the inflection points identified at 724 and the net charge amount determined at 730 using the methods disclosed herein.

Figure 8:
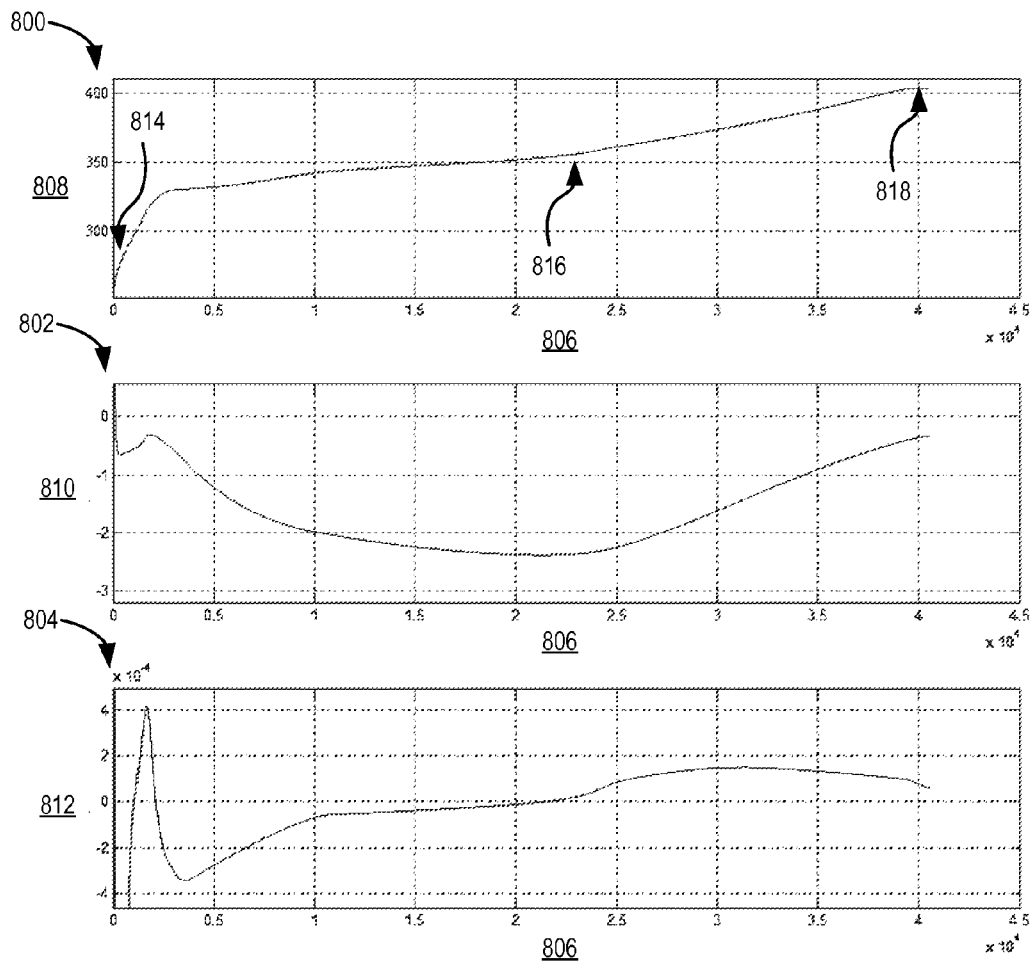
FIG. 8 illustrates graphs showing exemplary measured terminal voltages of a battery pack over time, exemplary skewness of the measured terminal voltages over time, and exemplary change rate of change of skewness of the measured terminal voltages over time consistent with embodiments disclosed herein.

FIG. 8 illustrates graphs 800-804 showing exemplary measured terminal voltages of a battery pack 808 over time 806 (i.e., graph 800), exemplary skewness of the measured terminal voltages 810 over time 806 (i.e., graph 802), and exemplary rate of change of skewness of the measured terminal voltages 812 over time 806 (i.e., graph 804) consistent with embodiments disclosed herein. In certain embodiments, the graphs 800-804 may be associated with exemplary terminal voltage measurements during charging operations of an associated battery pack.

As illustrated in graph 800, as a battery pack charges, its measured terminal voltage 808 may increase. Referring to the method illustrated in connection with FIG. 7, a determination (i.e., 720 in FIG. 7) may be made whether a voltage (e.g., a voltage at point 814) is below certain thresholds, which may indicate that the battery is beginning a full recharge cycle.

As the battery charges, an inflection point in the skewness of the measured terminal voltages, occurring at point 816 in the measured terminal voltage curve in graph 800, may be identified. Based on characterization information associating measured terminal voltages with SOCs of the battery pack, a SOC (e.g., a percentage of a total SOC) corresponding to the voltage at point 816 may be identified. At point 818, the measured terminal voltage curve in graph 800 may indicate the battery pack is charged. A capacity of the battery pack may be estimated using various information including an amount of charge (e.g., calculated using measured charging currents) provided to the battery pack during charging operations (e.g., charging from point 814 to point 818), an amount of charge provided to the battery pack from the start of charging operations to an identified skewness inflection point (e.g., between points 814 and 816) and/or a termination of charging operations to the identified skewness inflection point (e.g., between points 816 and 818), and/or SOCs associated with the various points (e.g., 814, 816, and 818) and associated net amounts of charge. In certain embodiments, the estimated capacity of the battery pack may be calculated during charging operations using a total charge amount provided to the battery pack during a charge cycle, a charge amount provided to the battery pack from an identified measured voltage skewness inflection point to a charge termination level (e.g., a level corresponding to a 100% SOC), and a SOC associated with the identified inflection point according to the following:

$$\text{Estimated } Capcity = \frac{\text{Total Charge} - \text{Charge from Inflection Point}}{100 - \% \ SOC \text{ Associated with Inflection Point}} \quad \text{Eq. 2}$$

It will be appreciated that an estimated capacity of the battery pack may be expressed in a variety of other ways in connection with the disclosed embodiments. For example, in some embodiments (e.g., during driving and/or battery pack discharging conditions), the disclosed systems and methods may utilize a net amount of charge discharged from the battery pack between identified voltage skewness inflection points and SOCs associated with the inflection points in calculating an estimated capacity of the battery pack. Similarly, it will be appreciated that Equation 2 may be suitably modified to be used with other charge termination levels (e.g., SOC levels of 70% or the like) in connection with determined an estimated capacity of the battery pack.

As an example, a battery pack may receive 85.2921 Ah of charge during a charging operation from an initial charging point to a charge termination point. During charging, an inflection point in the skewness of a measured terminal voltage may be identified. The voltage at the identified inflection point may be associated with a particular SOC of the battery system (e.g., as determined from terminal voltage/SOC characterization data and/or curves or the like). For example, the inflection point may be associated with 57% of a total SOC of the battery pack. The battery pack may be provided with 47.4312 Ah of charge during the charging operations to reach the voltage associated with the identified inflection point. Consistent with embodiments disclosed herein, in the above example, the estimated capacity of the battery pack may be calculated to be 88.0486 Ah.

Figure 9:
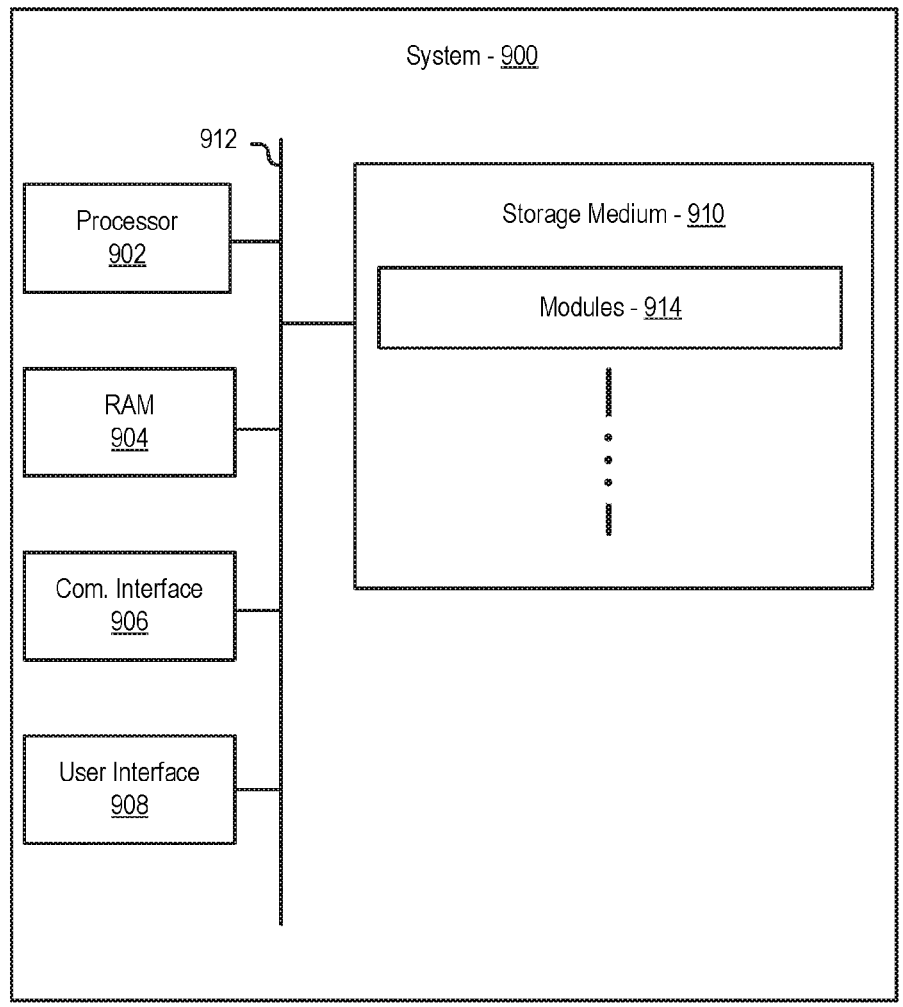
FIG. 9 illustrates an exemplary system for implementing certain embodiments of the systems and methods disclosed herein.

FIG. 9 illustrates an exemplary system for implementing certain embodiments of the systems and methods disclosed herein. In certain embodiments, the computer system 900 may be a personal computer system, a server computer system, an on-board vehicle computer, a battery control system, and/or any other type of system suitable for implementing the disclosed systems and methods. In further embodiments, the computer system 900 may be any portable electronic computer system or electronic device including, for example, a notebook computer, a smartphone, and/or a tablet computer.

As illustrated, the computer system 900 may include, among other things, one or more processors 902, random access memory ("RAM") 904, a communications interface 906, a user interface 908, and a non-transitory computer-readable storage medium 910. The processor 902, RAM 904, communications interface 906, user interface 908, and computer-readable storage medium 910 may be communicatively coupled to each other via a common data bus 912. In some embodiments, the various components of the computer system 900 may be implemented using hardware, software, firmware, and/or any combination thereof.

User interface 908 may include any number of devices allowing a user to interact with the computer system 900. For example, user interface 908 may be used to display an interactive interface to a user. The user interface 908 may be a separate interface system communicatively coupled with the computer system 900 or, alternatively, may be an integrated system such as a display interface for a laptop or other similar device. In certain embodiments, the user interface 908 may be produced on a touch screen display. The user interface 908 may also include any number of other input devices including, for example, keyboard, trackball, and/or pointer devices.

The communications interface 906 may be any interface capable of communicating with other computer systems, peripheral devices, and/or other equipment communicatively coupled to computer system 900. For example, the communications interface 906 may allow the computer system 900 to communicate with other computer systems (e.g., computer systems associated with external databases and/or the Internet), allowing for the transfer as well as reception of data from such systems. The communications interface 906 may include, among other things, a modem, a satellite data transmission system, an Ethernet card, and/or any other suitable device that enables the computer system 900 to connect to databases and networks, such as LANs, MANs, WANs and the Internet.

Processor 902 may include one or more general purpose processors, application specific processors, programmable microprocessors, microcontrollers, digital signal processors, FPGAs, other customizable or programmable processing devices, and/or any other devices or arrangement of devices that are capable of implementing the systems and methods disclosed herein.

Processor 902 may be configured to execute computer-readable instructions stored on non-transitory computer-readable storage medium 910. Computer-readable storage medium 910 may store other data or information as desired. In some embodiments, the computer-readable instructions may include computer executable functional modules 914. For example, the computer-readable instructions may include one or more functional modules configured to implement all or part of the functionality of the systems and methods described above. Specific functional models that may be stored on computer-readable storage medium 910 may include a module configured to perform battery capacity and/or state estimation methods and/or associated calculations consistent with embodiments disclosed herein, and/or any other module or modules configured to implement the systems and methods disclosed herein.

The system and methods described herein may be implemented independent of the programming language used to create the computer-readable instructions and/or any operating system operating on the computer system 900. For example, the computer-readable instructions may be written in any suitable programming language, examples of which include, but are not limited to, C, C++, Visual C++, and/or Visual Basic, Java, Perl, or any other suitable programming language. Further, the computer-readable instructions and/or functional modules may be in the form of a collection of separate programs or modules, and/or a program module within a larger program or a portion of a program module. The processing of data by computer system 900 may be in response to user commands, results of previous processing, or a request made by another processing machine. It will be appreciated that computer system 900 may utilize any suitable operating system including, for example, Unix, DOS, Android, Symbian, Windows, iOS, OSX, Linux, and/or the like.

Although the foregoing has been described in some detail for purposes of clarity, it will be apparent that certain changes and modifications may be made without departing from the principles thereof. It is noted that there are many alternative ways of implementing both the processes and systems described herein. Accordingly, the present embodiments are to be considered illustrative and not restrictive, and the invention is not to be limited to the details given herein, but may be modified within the scope and equivalents of the appended claims.

The foregoing specification has been described with reference to various embodiments. However, one of ordinary skill in the art will appreciate that various modifications and changes can be made without departing from the scope of the present disclosure. For example, various operational steps, as well as components for carrying out operational steps, may be implemented in alternate ways depending upon the particular application or in consideration of any number of cost functions associated with the operation of the system. Accordingly, any one or more of the steps may be deleted, modified, or combined with other steps. Further, this disclosure is to be regarded in an illustrative rather than a restrictive sense, and all such modifications are intended to be included within the scope thereof. Likewise, benefits, other advantages, and solutions to problems have been described above with regard to various embodiments. However, benefits, advantages, solutions to problems, and any element(s) that may cause any benefit, advantage, or solution to occur or become more pronounced, are not to be construed as a critical, a required, or an essential feature or element.

As used herein, the terms "comprises" and "includes," and any other variation thereof, are intended to cover a non-exclusive inclusion, such that a process, a method, an article, or an apparatus that comprises a list of elements does not include only those elements but may include other elements not expressly listed or inherent to such process, method, system, article, or apparatus. Also, as used herein, the terms "coupled," "coupling," and any other variation thereof are intended to cover a physical connection, an electrical connection, a magnetic connection, an optical connection, a communicative connection, a functional connection, and/or any other connection.

Those having skill in the art will appreciate that many changes may be made to the details of the above-described embodiments without departing from the underlying principles of the invention. The scope of the present invention should, therefore, be determined only by the following claims.

The invention claimed is:

1. A method of estimating a capacity of a battery pack, the method comprising:
   receiving, by battery control electronics associated with the battery pack from a voltage sensor configured to measure a terminal voltage of the battery pack, battery pack terminal voltage measurement information;
   calculating, by the battery control electronics, skewness information based on the battery pack terminal voltage measurement information, the skewness information defining a relationship between the battery pack terminal voltage measurement information and a plurality of states of charge of the battery pack;
   identifying, by the battery control electronics, a first inflection point in the skewness information;
   determining, by the battery control electronics, a first state of charge of the battery pack associated with the first inflection point;
   determining, by the battery control electronics, a second state of charge of the battery pack;
   determining, by the battery control electronics, a net charge difference of the battery pack between the first state of charge and the second state of charge;
   determining, by the battery control electronics, an estimated capacity of the battery pack based on the net charge difference, the first state of charge, and the second state of charge; and controlling, by the battery control electronics, an operation of the battery pack based on the estimated capacity of the battery pack, wherein the operation comprises at least one of a charging operation, a discharging operation, and a balancing operation.

2. The method of claim 1, wherein the first state of charge and the second state of charge comprise percentages of a total state of charge of the battery pack.

3. The method of claim 2, wherein determining the estimated capacity of the battery pack comprises dividing the net charge difference by a difference of the first state of charge and the second state of charge.

4. The method of claim 1, wherein the second state of charge comprises a state of charge associated with a charge termination level of the battery pack.

5. The method of claim 1, wherein the second state of charge comprises a state of charge associated with a depleted battery pack.

6. The method of claim 1, wherein the net charge difference comprises an amount of charge provided to the battery pack between the first state of charge and the second state of charge during charging operations.

7. The method of claim 1, wherein the net charge difference comprises an amount of charge discharged from the battery pack between the first state of charge and the second state of charge during discharging operations.

8. The method of claim 1, wherein the method further comprises identifying a second inflection point in the skewness information; and determining the second state of charge of the battery pack based on the second inflection point.

9. A system comprising:

a battery pack;

a voltage sensor configured to measure a terminal voltage of the battery pack; and battery control electronics communicatively coupled to the voltage sensor, the battery control electronics being configured to:

receive battery pack terminal voltage measurement information from the voltage sensor;

calculate skewness information based on the battery pack terminal voltage measurement information, the skewness information defining a relationship between the battery pack terminal voltage measurement information and a plurality of states of charge of the battery pack;

identify a first inflection point in the skewness information;

determine a first state of charge of the battery pack associated with the first inflection point;

determine a second state of charge of the battery pack;

determine a net charge difference of the battery pack between the first state of charge and the second state of charge; and determine an estimated capacity of the battery pack based on the net charge difference, the first state of charge, and the second state of charge.

10. The system of claim 9, wherein the first state of charge and the second state of charge comprise percentages of a total state of charge of the battery pack.

11. The system of claim 10, wherein determining the estimated capacity of the battery pack comprises dividing the net charge difference by a difference of the first state of charge and the second state of charge.

12. The system of claim 9, wherein the second state of charge comprises a state of charge associated with a charge termination level of the battery pack.

13. The system of claim 9, wherein the second state of charge comprises a state of charge associated with a depleted battery pack.

14. The system of claim 9, wherein the net charge difference comprises an amount of charge provided to the battery pack between the first state of charge and the second state of charge during charging operations.

15. The system of claim 9, wherein the net charge difference comprises an amount of charge discharged from the battery pack between the first state of charge and the second state of charge during discharging operations.

16. The system of claim 9, wherein the battery control electronics are further configured to:

identify a second inflection point in the skewness information; and determine the second state of charge of the battery pack based on the second inflection point.

17. A non-transitory computer-readable medium comprising instructions that, when executed by a processor included in battery control electronics associated with a battery pack, cause the processor to perform a method for estimating a capacity of the battery pack comprising:

receiving, from a voltage sensor configured to measure a terminal voltage of the battery pack, battery pack terminal voltage measurement information;

calculating skewness information based on the battery pack terminal voltage measurement information, the skewness information defining a relationship between the battery pack terminal voltage measurement information and a plurality of states of charge of the battery pack;

identifying a first inflection point in the skewness information;

determining a first state of charge of the battery pack associated with the first inflection point;

determining a second state of charge of the battery pack;

determining a net charge difference of the battery pack between the first state of charge and the second state of charge;

determining an estimated capacity of the battery pack based on the net charge difference, the first state of charge, and the second state of charge; and controlling, by the battery control electronics, an operation of the battery pack based on the estimated capacity of the battery pack, wherein the operation comprises at least one of a charging operation, a discharging operation, and a balancing operation.

18. The non-transitory computer-readable medium of claim 17, wherein the first state of charge and the second state of charge comprise percentages of a total state of charge of the battery pack.

19. The non-transitory computer-readable medium of claim 18, wherein determining the estimated capacity of the battery pack comprises dividing the net charge difference by a difference of the first state of charge and the second state of charge.

* * * * *